United States Patent
Lang et al.

(10) Patent No.: US 9,680,400 B2
(45) Date of Patent: Jun. 13, 2017

(54) METHOD AND DEVICE FOR GENERATING ELECTRICAL ENERGY IN A MOTOR VEHICLE

(71) Applicant: Daimler AG, Stuttgart (DE)

(72) Inventors: Swen Lang, Hohenstein (DE); Tobias Sommerfeld, Buchholz (DE); Thomas Stengel, Ulm (DE)

(73) Assignee: Daimler AG, Stuttgart (DE)

( * ) Notice: Subject to any disclaimer, the term of this patent is extended or adjusted under 35 U.S.C. 154(b) by 548 days.

(21) Appl. No.: 14/351,426

(22) PCT Filed: Sep. 26, 2012

(86) PCT No.: PCT/EP2012/004021
§ 371 (c)(1),
(2) Date: Apr. 11, 2014

(87) PCT Pub. No.: WO2013/053431
PCT Pub. Date: Apr. 18, 2013

(65) Prior Publication Data
US 2014/0252851 A1    Sep. 11, 2014

(30) Foreign Application Priority Data

Oct. 12, 2011  (DE) .................. 10 2011 115 775

(51) Int. Cl.
*H02N 11/00* (2006.01)
*H01L 35/32* (2006.01)
(Continued)

(52) U.S. Cl.
CPC .......... *H02N 11/002* (2013.01); *B60L 11/002* (2013.01); *B60L 11/1855* (2013.01);
(Continued)

(58) Field of Classification Search
CPC .............. B60L 11/002; B60L 11/1855; B60L 2240/445; B60L 2240/547; H01L 35/00;
(Continued)

(56) References Cited

U.S. PATENT DOCUMENTS 3,197,342 A * 7/1965 Neild, Jr. ................ H01L 35/32
136/210
4,175,249 A  11/1979 Gruber
(Continued)

FOREIGN PATENT DOCUMENTS

DE    32 45 866 A1    6/1984
DE    41 18 979 A1    12/1992
(Continued)

OTHER PUBLICATIONS

International Search Report (PCT/ISA/210) with English translation dated Apr. 19, 2013 (Seven (7) pages).
(Continued)

*Primary Examiner* — Levi Gannon
(74) *Attorney, Agent, or Firm* — Crowell & Moring LLP

(57) ABSTRACT

A method and device for generating electrical energy in a motor vehicle involves thermoelectric generator having a plurality of thermoelectric modules and coupled to at least one electrical consumer. Module open-circuit voltages of the modules are determined and those modules for which a sum of their module open-circuit voltages attains twice a predefined generator output voltage with the smallest possible deviation are determined and electrically connected to one another in series.

8 Claims, 4 Drawing Sheets

Figure 1:
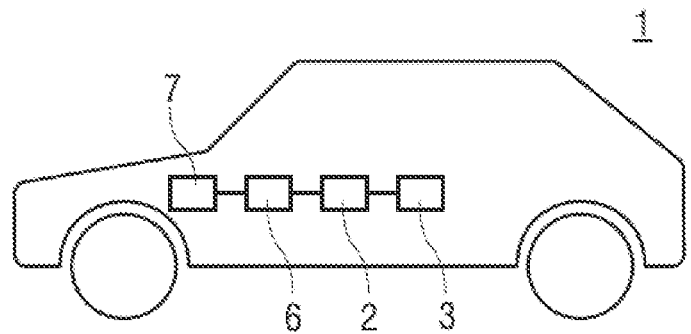

(51) Int. Cl.
*B60L 11/18* (2006.01)
*B60L 11/00* (2006.01)

(52) U.S. Cl.
CPC ............ *H01L 35/32* (2013.01); *H01L 35/325* (2013.01); *B60L 2240/445* (2013.01); *B60L 2240/547* (2013.01); *Y02T 10/166* (2013.01); *Y02T 10/705* (2013.01); *Y02T 10/7005* (2013.01)

(58) Field of Classification Search
CPC ......... H01L 35/28; H01L 35/30; H01L 35/32; H01L 35/325; H02N 11/002; Y02T 10/166; Y02T 10/705; Y02T 10/7005
USPC ................................................ 307/9.1, 10.1
See application file for complete search history.

(56) References Cited

U.S. PATENT DOCUMENTS

| | | | | |
|---|---|---|---|---|
| 4,653,443 A | * | 3/1987 | Fukazawa | F23Q 7/001 123/145 A |
| 5,554,819 A | * | 9/1996 | Baghai-Kermani | B64D 41/00 136/206 |
| 5,576,512 A | * | 11/1996 | Doke | H02H 11/007 136/203 |
| 5,705,770 A | | 1/1998 | Ogasawara et al. | |
| 6,028,263 A | * | 2/2000 | Kobayashi | H01L 35/00 136/201 |
| 6,166,317 A | * | 12/2000 | Volk, Jr. | B60L 11/18 136/201 |
| 7,878,283 B2 | | 2/2011 | Richter et al. | |
| 7,946,120 B2 | * | 5/2011 | Bell | F02G 1/043 62/3.3 |
| 2010/0024859 A1 | * | 2/2010 | Bell | F01N 5/025 136/201 |
| 2010/0146991 A1 | * | 6/2010 | Ilercil | F25B 21/02 62/3.3 |
| 2011/0082607 A1 | * | 4/2011 | Chorian | B60K 6/445 701/22 |
| 2011/0113767 A1 | * | 5/2011 | Richter | F01N 5/025 60/320 |
| 2015/0101646 A1 | * | 4/2015 | Lamba | B61O 5/00 136/205 |

FOREIGN PATENT DOCUMENTS

| | | |
|---|---|---|
| DE | 10 2006 057 662 A1 | 6/2008 |
| DE | 10 2007 005 520 A1 | 8/2008 |
| DE | 10 2009 019 608 A1 | 11/2010 |
| EP | 0 878 851 A2 | 11/1998 |
| JP | 9-15353 A | 1/1997 |
| JP | 2008-22688 A | 1/2008 |
| JP | 2010-41903 A | 2/2010 |
| JP | 2011-160552 A | 8/2011 |

OTHER PUBLICATIONS

German language Written Opinion (PCT/ISA/237) dated Apr. 19, 2013 (Nine (9) pages).
Omer S.A. et al: "Design optimization of thermoelectric devices for solar power generation", Solar Energy Materials and Solar Cells, ElSevier Science Publishers, Amsterdam, NL, vol. 53, No. 1-2, 1. May 1, 1998, pp. 67-82, (Sixteen (16) pages).
Nagayoshi H. et al: "Mismatch Power Loss Reduction on Thermoelectric Generator Systems Using Maximum Power Point Trackers", Thermoelectrics, 2006. ICT '06. 25$^{th}$ International Conference on Thermoelectrics, IEEE, PI, Aug. 1, 2006, pp. 210-213, (Four (4) pages).

* cited by examiner

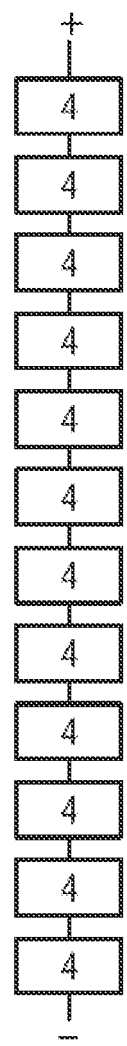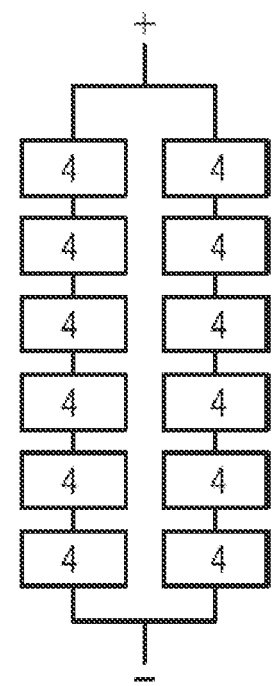
FIG 3
FIG 4

METHOD AND DEVICE FOR GENERATING ELECTRICAL ENERGY IN A MOTOR VEHICLE

BACKGROUND AND SUMMARY OF THE INVENTION

Exemplary embodiments of the invention relate to a method and device for generating electrical energy.

A device for generating current for units provided in a motor vehicle, in particular for a washing system, is disclosed in German patent document DE 41 18 979 A1. The washing system includes a reservoir for holding fluid which via at least one supply line is in connection with a nozzle having an outlet opening. The fluid present in the system is heatable via a heating device, composed of at least one thermogenerator situated in the region of the exhaust manifold.

German patent document DE 10 2007 005 520 A1 discloses a vehicle having a thermoelectric generator. The vehicle includes a heat-releasing component and the thermoelectric generator, which has a heat-absorbing element thermally coupled to the heat-releasing component, and which generates electrical energy based on the temperature gradient between the heat-absorbing element and a heat sink. The thermoelectric generator is situated directly at the heat-releasing component, and is thus connected thereto in a thermally conductive manner.

German patent document DE 10 2006 057 662 A1 discloses a vehicle having a thermoelectric generator. The vehicle includes an internal combustion engine and the thermoelectric generator, which has at least one element that absorbs heat from a heat source and at least one element that releases heat to a heat sink, and two electrical connections via which the thermoelectric generator may deliver electrical energy. A heat exchanger is provided which has the heating elements thermally connected to the at least one heat-absorbing element of the thermoelectric generator, and cooling elements thermally connected to the at least one heat-releasing element of the thermoelectric generator. Exhaust gas flows through and around the heating elements, which are situated in the exhaust duct of the internal combustion engine.

Japanese patent document JP 2008022688 A describes a system for determining a maximum performance point of a thermoelectric generator and control of the thermoelectric generator into the maximum performance point. In the process, an internal resistance of the thermoelectric generator is measured. In addition, a resistance is determined by measuring an input current and voltage during operation. The control is carried out in such a way that the value of the load resistance corresponds to the value of the internal resistance of the thermoelectric generator.

German patent document DE 32 45 866 A1 discloses a system and method for regulating alternative energy sources to maximum power. An adaptor device between the energy source and the consumer is regulated in such a way that the power delivered in each case at the highest and the lowest voltage value is determined from current and voltage fluctuations and stored. Based on the stored values, a difference is continuously formed whose value and polarity indicate the magnitude and the direction of the instantaneous operating point from the maximum performance point. At the same time, this information is used to form a signal for the command variable for the adaptor device.

Exemplary embodiments of the present invention are directed to an improved method and device for generating electrical energy, and use of a method and/or a device for generating electrical energy.

In a method for generating electrical energy by means of a thermoelectric generator, which is coupled to at least one electrical consumer and has a plurality of thermoelectric modules, according to the invention module open-circuit voltages of the modules are determined, and those modules for which a sum of their module open-circuit voltages attains twice a predefined generator output voltage with the smallest possible deviation are determined and electrically connected to one another in series.

"A plurality of components" is understood to mean a number of components that is at least two.

According to the invention, a device for generating electrical energy for carrying out the method includes a thermoelectric generator which is coupled to at least one electrical consumer and has a plurality of thermoelectric modules.

According to the invention, module open-circuit voltages of the modules are determinable, and those modules for which a sum of their module open-circuit voltages attains twice a predefined generator output voltage with the smallest possible deviation are determinable and electrically connectable to one another in series. The method and the device are usable in a motor vehicle.

By means of the method and the device, the thermoelectric generator or its modules may be easily and efficiently operated at a maximum performance point or at least close to the maximum performance point. Module output voltages correspond to the respective modules when the modules are operated at the maximum performance point, which is one-half the particular module open-circuit voltage. The predefined generator output voltage corresponds to an input voltage of the electrical consumer, for example an electrical system of the motor vehicle. When the modules are connected to one another according to the invention and connected to the vehicle electrical system, comprising at least one voltage-stabilizing component (battery, generator, or capacitor) and electrical consumers, since the electrical load is large with respect to the generator and therefore is a stronger partner with respect to the thermoelectric generator, the generator output voltage of the thermoelectric generator adapts to the voltage of the vehicle electrical system; i.e., the module output voltages of the modules then correspond to one-half or at least close to one-half the particular module open-circuit voltage, and thus to the voltage at the maximum performance point or at least close to the respective performance point of the particular module.

The module output voltages of the modules are thus automatically brought to the output voltages at their respective maximum performance point or at least close to their respective maximum performance point, and the modules are thus operated at their respective maximum performance point or at least close to their respective maximum performance point. The sum of the output voltages of the modules electrically connected to one another in series then corresponds to the generator output voltage of the thermoelectric generator and to the input voltage of the electrical consumer.

If the sum of the module open-circuit voltages corresponded to exactly twice the predefined generator output voltage before the modules were connected, the modules are now operated exactly at their respective maximum performance point, and the sum of the output voltages of the modules at their respective maximum performance point corresponds exactly to the generator output voltage and to the input voltage of the electrical consumer. If the sum of the module open-circuit voltages differed from twice the predefined generator output voltage with the smallest possible deviation before the modules were connected, now the modules are not operated exactly at their respective maximum performance point, but are operated at least close to their respective maximum performance point with the smallest possible deviation therefrom. If the modules had been operated at their respective maximum performance point, the sum of the output voltages of the modules would then be close to the actual generator output voltage and to the input voltage of the electrical consumer with the smallest possible deviation therefrom.

A d.c.-d.c. converter is not necessary for carrying out the method. In addition, the method and the device allow dynamic control and/or regulation of the thermoelectric generator. This is very advantageous in particular when the thermoelectric generator is used in a motor vehicle, since temperature differences between the hot side and the cold side continually change. The thermoelectric generator is thermally coupled via its hot side or via the hot side of its modules to an exhaust system of the motor vehicle, for example. In addition, very large voltage and power fluctuations result due to the very large temperature ranges that occur in the automotive area, which may have variations between 0 K and 700 K in the temperature difference over the thermoelectric generator. Processing of these fluctuations by a d.c.-d.c. converter is possible, if at all, only in an inefficient manner.

The cost for the device in order to carry out the method in the motor vehicle is significantly lower due to the fact that the d.c.-d.c. converter is not necessary. In addition, the weight, required installation space, and complexity of the device are significantly less.

Multiple groups of modules electrically connected to one another in series are advantageously electrically connected to one another in parallel. This is particularly meaningful when not all of the modules of the thermoelectric generator are needed in order for the sum of their module open-circuit voltages to attain twice the predefined generator output voltage. If several of these groups of modules are present, whose sum of the module open-circuit voltages in each case attains twice the predefined generator output voltage, these groups may be connected in parallel in order to increase the output current intensity of the thermoelectric generator. In this way, all or at least as many of the modules of the thermoelectric generator as possible are usable at any time for generating electrical energy for the electrical consumer.

Advantageously, the module open-circuit voltages are measured and/or temperatures of the hot sides and/or the cold sides of the modules are measured, and on this basis the module open-circuit voltages are determined, and/or a temperature and a mass flow of a hot side medium and/or of a cold side medium are determined, and on this basis the module open-circuit voltages and/or the module open-circuit voltages are determined with reference to at least one predefined characteristic map. Input variables of the predefined characteristic map may be, for example, the determined temperatures of the hot sides and/or of the cold sides of the modules, and/or the determined temperature and the determined mass flow of the hot side medium and/or of the cold side medium, and/or parameters that are read from the control units of the motor vehicle. Output variables of the characteristic map may then be the module open-circuit voltages of the individual modules and/or connection defaults for the particular electrical connection of the modules. These options allow the quickest possible and precise determination of the module open-circuit voltages, and thus, rapid and dynamic adaptation of the electrical connection of the modules to changed conditions. This allows the modules to always be operated at their respective maximum performance point or at least close to the maximum performance point, even under conditions that change frequently and very dynamically, which occur in particular in a motor vehicle, for example in an exhaust system of the motor vehicle. Optimal energy-efficient utilization of the thermoelectric generator is thus made possible.

The device advantageously includes switches for electrically connecting the modules in order to allow rapid automatic electrical connection of the modules and thus an adaptation of the connection to the particular conditions acting on the thermoelectric generator. For a very small number of modules, for example only two modules, or for two relatively homogeneous groups of modules, for example, only one such switch, for example, would be necessary for electrically connecting the modules or module groups to one another either in series or in parallel.

The switches are advantageously designed as semiconductor switches to allow a cost-effective, simple, installation space-saving, and efficient implementation of the device. However, numerous other switches, such as relays, are also possible.

The device advantageously includes a processing unit for determining the module open-circuit voltages of the modules and/or for electrically connecting the modules corresponding to the determined module open-circuit voltages, i.e., for controlling the switches, for example the semiconductor switches. The processing unit is designed as a microcontroller, for example. This microcontroller is connected via driver stages, for example, i.e., via power switches, to the switches for electrically connecting the modules in order to control them.

In one advantageous embodiment, the device includes at least one sensor unit or a plurality of sensor units. By means of this sensor unit or the plurality of sensor units, for example module open-circuit voltages of the modules are directly measurable, and/or temperatures of hot sides and/or of cold sides of the modules are measurable, and/or a temperature and a mass flow of a hot side medium and/or of a cold side medium are determinable. Using the device with the method allows the particular module open-circuit voltages of the individual modules to be determined. Alternatively or additionally, the device may advantageously access characteristic maps, models, and/or parameters of the motor vehicle that are stored, for example, in control units of the motor vehicle, for example in an engine control unit, to thus determine an instantaneous state of the motor vehicle, its engine, for example, in particular to determine, for example, instantaneous exhaust gas temperatures and/or coolant temperatures and the instantaneous module open-circuit voltages of the modules over these temperatures.

BRIEF DESCRIPTION OF THE DRAWING FIGURES

Figure 2:
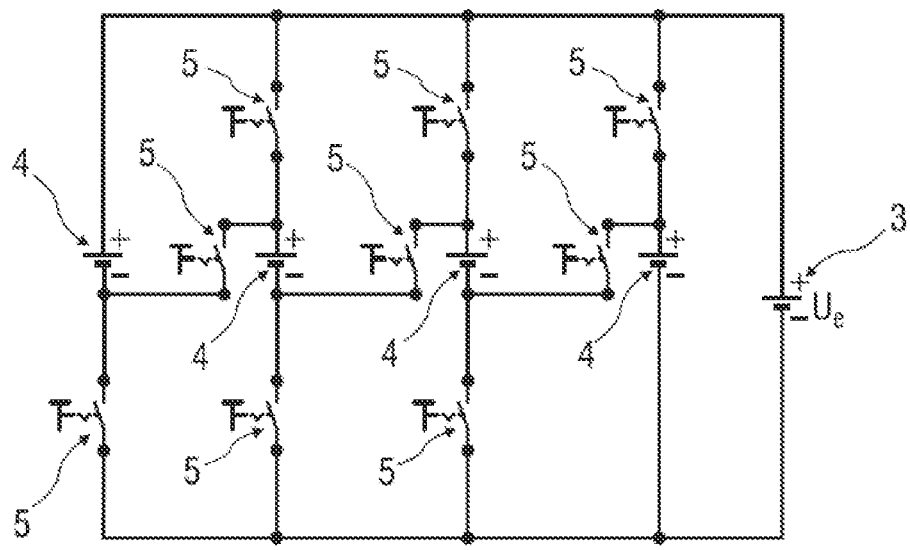
Figure 5:
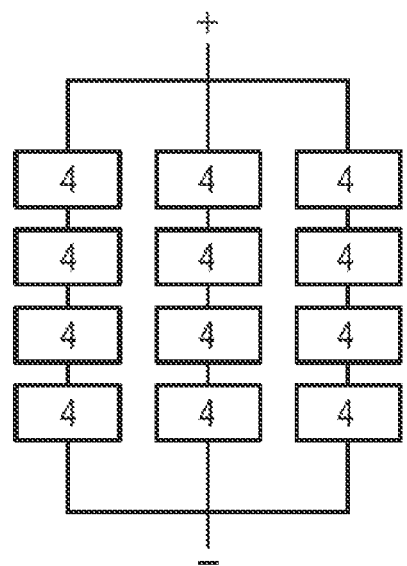
Figure 6:
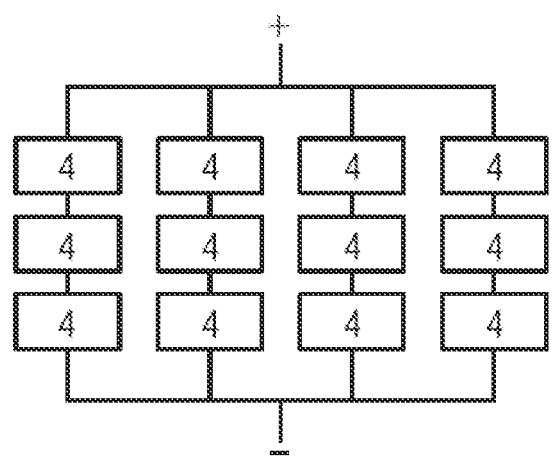
Figure 7:
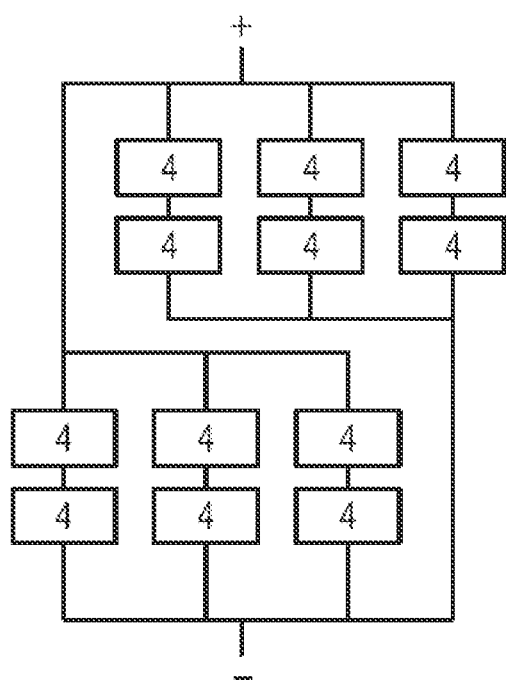

Exemplary embodiments of the invention are explained in greater detail below with reference to the drawings, which show the following:

FIG. 1 schematically shows a motor vehicle having a device for generating electrical energy, FIG. 2 schematically shows modules of a thermoelectric generator that are electrically connectable to one another via switches and connectable to an electrical system of a motor vehicle, FIG. 3 schematically shows a first electrical connection of modules of a thermoelectric generator, FIG. 4 schematically shows a second electrical connection of modules of a thermoelectric generator, FIG. 5 schematically shows a third electrical connection of modules of a thermoelectric generator, FIG. 6 schematically shows a fourth electrical connection of modules of a thermoelectric generator, and FIG. 7 schematically shows a fifth electrical connection of modules of a thermoelectric generator.

Mutually corresponding parts are provided with the same reference numerals in all the figures.

DETAILED DESCRIPTION

FIG. 1 schematically shows a motor vehicle 1 having a device for generating electrical energy. The device includes a thermoelectric generator 2 coupled to at least one electrical consumer 3, in the example illustrated here, a vehicle electrical system, in particular a starter battery of the motor vehicle 1. In addition, the thermoelectric generator 2 is thermally coupled, for example, to an exhaust system of the motor vehicle 1.

A thermoelectric generator 2 of this type is a direct energy converter that generates an electrical voltage based on a temperature difference that is present. For this purpose, a heat source is necessary on a hot side, and a heat sink is necessary on a cold side. Various operating principles, for example the Seebeck effect or the Joule effect, are suitable for the energy conversion.

In the embodiment illustrated here, the heat source to which the hot side of the thermoelectric generator 2 is thermally coupled is, for example, an exhaust system of the motor vehicle 1 and/or an exhaust gas medium of an internal combustion engine of the motor vehicle 1, which forms a hot side medium and flows through the exhaust system. The heat sink to which the cold side of the thermoelectric generator 2 is thermally coupled is formed, for example, by the surroundings of the thermoelectric generator 2 and/or by a cooling medium supply to the cold side of the thermoelectric generator 2. A cooling medium of the cooling medium supply then forms a cold side medium. The cooling medium supply may be a cooling fluid supply, for example, the thermoelectric generator 2 being thermally coupled, for example, to a coolant circuit of the motor vehicle 1 or to an additional coolant circuit. Alternatively or additionally, the cooling medium supply may also be implemented by air cooling of the cold side of the thermoelectric generator 2.

As illustrated in FIGS. 2 through 7, the thermoelectric generator 2 is composed of a plurality of thermoelectric modules 4 that are electrically connectable in different configurations and connection options, i.e., in parallel and/or in series. The modules 4 each comprise a plurality of semiconductor pairs connected in series. The pairs are composed of two different semiconductor materials which are connected in a thermally and electrically conductive manner.

In addition, the device has switches 5, not illustrated in greater detail in FIG. 2, for electrically connecting the modules 4. These switches 5 are designed as semiconductor switches, for example. For electrically connecting the modules 4 of the thermoelectric generator 2, with appropriate control of the switches 5 each of the modules 4 may be connected to an adjacent module 4 or directly to an output of the thermoelectric generator 2 by means of the switches 5.

In addition, the device has a processing unit 6 for determining module open-circuit voltages of the modules 4 and/or for connecting the modules 4 corresponding to the determined module open-circuit voltages, i.e., for controlling the switches 5. For this purpose, the processing unit 6 is connected to the respective switches 5 via driver stages, for example. The processing unit 6 is designed as a microcontroller, for example.

Furthermore, in this exemplary embodiment the device has at least one sensor unit 7. By use of this sensor unit 7 or a plurality of sensor units 7, for example the module open-circuit voltages of the modules 4 are directly measurable, and/or temperatures of hot sides and/or of cold sides of the modules 4 are measurable, and/or a temperature and a mass flow of the hot side medium and/or of the cold side medium are determinable. Alternatively or additionally, the device may advantageously access characteristic maps, models, and/or parameters of the motor vehicle 1 stored, for example, in control units of the motor vehicle 1, for example in an engine control unit, in order to determine an instantaneous state of the motor vehicle 1, of its internal combustion engine, for example, in particular instantaneous exhaust gas temperatures and/or coolant temperatures, for example, and the instantaneous module open-circuit voltages of the modules 4 over these temperatures.

A method, explained in greater detail below, for generating electrical energy by means of the thermoelectric generator 2 may be carried out using the device.

By means of the method and the device, the module open-circuit voltages of the modules 4 are determined, and those modules 4 for which a sum of their module open-circuit voltages attains twice a predefined generator output voltage with the smallest possible deviation are determined and electrically connected to one another in series, as illustrated by way of example in FIGS. 3 through 7. If a plurality of groups of modules 4 electrically connected to one another in series is present, these groups are electrically connected to one another in parallel, as schematically illustrated in FIGS. 4 through 7.

The predefined generator output voltage advantageously corresponds to an input voltage $U_e$ of the electrical consumer 3. Since in this exemplary embodiment the electrical consumer 3 is the electrical system of the motor vehicle 1 or its starter battery that is to be charged by the thermoelectric generator 2, the input voltage $U_e$ and therefore also the predefined generator output voltage is twelve volts for a 12-V vehicle electrical system. The modules 4 for the electrical connection in series are therefore selected in such a way that the sum of their module open-circuit voltages has the smallest possible deviation from twice the predefined generator output voltage or from twice the input voltage $U_e$ of the electrical consumer. That is, the sum of the selected modules 4 to be electrically connected to one another in series is preferably exactly 24 volts, or slightly more or slightly less than 24 volts with the smallest possible deviation from this value.

The module open-circuit voltages of the modules 4, and therefore the electrical connection of the modules 4, are a function of the temperature difference between the hot side and the cold side of the modules 4. Thus, for a small temperature difference the modules 4 generate only a low module open-circuit voltage, so that correspondingly more modules 4 must be electrically connected to one another in series in order to attain twice the predefined generator output voltage. This is illustrated in FIG. 3, for example. Here, all modules 4 of the thermoelectric generator 2, twelve in the present example, are electrically connected to one another in series in order for the sum of their module open-circuit voltages to attain twice the predefined generator output voltage. This is the case, for example, immediately after starting the internal combustion engine of the motor vehicle 1 and/or under a very low load and/or at low speeds of the internal combustion engine, when an exhaust gas temperature and/or a mass flow of the exhaust gas medium, i.e., the hot side medium, is/are relatively low.

As the temperature difference increases, for example only six modules 4 are necessary in order for the sum of the module open-circuit voltages to attain twice the predefined generator output voltage, as illustrated in FIG. 4, since each individual module 4 now has a higher module open-circuit voltage. Therefore, two of these groups of modules 4 electrically connected in series may be electrically connected to one another in parallel to achieve a higher current intensity of the thermoelectric generator 2. This is the case, for example, for a higher operating temperature of the internal combustion engine and/or a higher load and/or at higher speeds of the internal combustion engine, i.e., for a higher exhaust gas temperature and/or a higher mass flow of the exhaust gas medium, i.e., the hot side medium.

As the temperature difference further increases, for example for a more intensely heated exhaust system and/or exhaust gas medium of the motor vehicle 1, for example electrical connections in series of only four modules 4, as illustrated in FIG. 5, or of three modules 4, as illustrated in FIG. 6, or of two modules 4, as illustrated in FIG. 7, are necessary in order for the sum of the module open-circuit voltages of the modules 4, which in each case are to be electrically connected to one another in series, to attain twice the predefined generator output voltage. Correspondingly, three groups, as illustrated in FIG. 5, four groups, as illustrated in FIG. 6, or six groups, as illustrated in FIG. 7, which are electrically connected to one another in series may then be electrically connected to one another in parallel in order to increase the current intensity of the thermoelectric generator 2.

Of course, in addition to the temperature and/or the mass flow of the hot side medium, the temperature and/or the mass flow of the cold side medium has/have an influence on the temperature difference. If the cold side of the thermoelectric generator 2 or the cold sides of the modules 4 thereof are thermally coupled to the coolant circuit of the motor vehicle 1, for example, the coolant circuit is also subject to changes in temperature and/or mass flow due to the cooling of the internal combustion engine, which via the temperature of the cold sides of the modules 4 likewise have an influence on the temperature difference of the particular module 4, and thus on the particular module open-circuit voltage.

For determining the module open-circuit voltages of the individual modules 4, these voltages may be directly measured, for example, by decoupling the modules 4, for example cyclically at predefined time intervals, from the connection to the electrical consumer 3, i.e., to the electrical system of the motor vehicle 1, and measuring their module open-circuit voltage in open-circuit mode. Alternatively or additionally, for example temperatures of the hot sides and/or of the cold sides of the modules 4 may be measured, and on this basis the module open-circuit voltages are determined via simulations, for example, and/or a temperature and a mass flow of the hot side medium and/or of the cold side medium are determined and on this basis the module open-circuit voltages are determined via simulations, for example, and/or the module open-circuit voltages are determined with reference to at least one predefined characteristic map. Input variables of the predefined characteristic map may be, for example, the determined temperatures of the hot sides and/or of the cold sides of the modules 4, and/or the determined temperature and the determined mass flow of the hot side medium and/or of the cold side medium, and/or parameters read out from the control units of the motor vehicle 1. Output variables of the characteristic map may then be the module open-circuit voltages of the individual modules 4 and/or connection defaults for the particular electrical connection of the modules 4.

By use of the method and the device, the thermoelectric generator 2 or its modules 4 may be simply and efficiently operated at a maximum performance point or at least close to the maximum performance point. Module output voltages correspond to the respective modules 4 when they are operated at the maximum performance point, which is one-half the particular module open-circuit voltage. The predefined generator output voltage corresponds to the input voltage $U_e$ of the electrical consumer 3, i.e., of the electrical system of the motor vehicle 1 or its starter battery. When the modules 4 are connected to one another in the described manner and connected to the electrical consumer 3, since the electrical load is large with respect to the thermoelectric generator 2 and therefore a stronger partner with respect to the thermoelectric generator 2, the generator output voltage of the thermoelectric generator 2 adapts to the input voltage $U_e$ of the electrical consumer 3, since the electrical consumer 3, i.e., the electrical system of the motor vehicle 1, imposes its default voltage on the thermoelectric generator 2. That is, the module output voltages of the modules 4 then correspond to one-half or at least close to one-half the particular module open-circuit voltage, and thus to the voltage at the maximum performance point or at close to the respective performance point of the particular module 4.

The module output voltages of the modules 4 are thus automatically brought to the output voltages at their respective maximum performance point or at least close to their respective maximum performance point, and the modules 4 are thus operated at their respective maximum performance point or at least close to their respective maximum performance point. The sum of the output voltages of the modules 4 which are electrically connected to one another in series then corresponds to the generator output voltage of the thermoelectric generator 2 and to the input voltage $U_e$ of the electrical consumer 3.

If the sum of the module open-circuit voltages corresponded to exactly twice the predefined generator output voltage before the modules 4 were connected, the modules 4 are now operated exactly at their respective maximum performance point, and the sum of the output voltages of the modules at their respective maximum performance point corresponds exactly to the generator output voltage and to the input voltage $U_e$ of the electrical consumer 3. If the sum of the module open-circuit voltages differed from twice the predefined generator output voltage with the smallest possible deviation before the modules 4 were connected, now the modules 4 are not operated exactly at their respective maximum performance point, but are operated at least close to their respective maximum performance point with the smallest possible deviation therefrom. If the modules had been operated at their respective maximum performance point, the sum of the output voltages of the modules 4 would then be close to the actual generator output voltage and to the input voltage $U_e$ of the electrical consumer 3 with the smallest possible deviation therefrom.

If the temperature differences of the modules 4 change, the module open-circuit voltages must accordingly be redetermined and the modules 4 correspondingly reconnected to one another in order to always operate the modules 4, and thus the thermoelectric generator 2, at the maximum performance point or at least as close as possible to the maximum performance point. This redetermination of the module open-circuit voltages and the correspondingly adapted connection of the modules 4 takes place, for example, cyclically at predefined intervals and/or when changes in determined values are identified, for example, for identified changes in the measured module open-circuit voltages, and/or the temperatures of the hot sides and/or the cold sides of the modules 4, and/or the temperature and the mass flow of the hot side medium and/or of the cold side medium, and/or for identified changes in parameters that are read out from control units of the motor vehicle 1, for example engine parameters and/or exhaust gas parameters of the internal combustion engine of the motor vehicle 1 and/or other parameters concerning the operating state of the internal combustion engine and/or the motor vehicle 1.

A d.c.-d.c. converter is not necessary for carrying out the method. In addition, the method and the device allow dynamic control and/or regulation of the thermoelectric generator 2. This is very advantageous in particular when the thermoelectric generator 2 is used in a motor vehicle 1, since temperature differences between the hot side and the cold side continually change. The thermoelectric generator 2 is thermally coupled via its hot side or via the hot side of its modules 4, as described above, to the exhaust system of the motor vehicle 1, for example. In addition, very large voltage and power fluctuations result due to the very large temperature ranges that occur in the automotive area, which may have variations between 0 K and 700 K in the temperature difference over the thermoelectric generator. Processing of these fluctuations by a d.c.-d.c. converter is possible, if at all, only in an inefficient manner.

The cost for the device in order to carry out the method in the motor vehicle 1 is significantly lower due to the fact that the d.c.-d.c. converter is not necessary. In addition, the weight, required installation space, and complexity of the device are significantly less.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF REFERENCE NUMERALS

1 Motor vehicle
2 Generator
3 Consumer
4 Module
5 Switch
6 Processing unit
7 Sensor unit
$U_e$ Input voltage

The invention claimed is:

1. A method for generating electrical energy in a motor vehicle using a thermoelectric generator coupled to at least one electrical consumer and having a plurality of thermoelectric modules, the method comprising:
    determining module open-circuit voltages of the plurality of thermoelectric modules by a processor coupled to the thermoelectric generator;
    determining, using the determined module open-circuit voltages, a group of modules of the plurality of thermoelectric modules having a sum of the determine module open-circuit voltages that is twice a predefined generator output voltage with the smallest possible deviation by the processor; and
    electrically connecting modules of the group of modules to one another in series as controlled by the processor.

2. The method of claim 1, wherein multiple groups of modules electrically connected to one another in series are electrically connected to one another in parallel.

3. The method of claim 1, further comprising:
    measuring temperatures of hot sides or cold sides of the plurality of thermoelectric modules;
    determining a temperature and a mass flow of a hot side medium or a cold side medium using the measured temperatures,
    wherein the module open-circuit voltages are using the determined temperature with reference to at least one predefined characteristic map.

4. A device, comprising:
    a thermoelectric generator having a plurality of thermoelectric modules, wherein the thermoelectric generator is coupled to at least one electrical consumer; and
    a processor coupled to the thermoelectric generator and configured to:
        determine module open-circuit voltages of the plurality of thermoelectric modules;
        determine, using the determined module open-circuit voltages, a group of modules of the plurality of thermoelectric modules having a sum of the determine module open-circuit voltages that is twice a predefined generator output voltage with the smallest possible deviation; and
        control electrical connection of modules of the group of modules to one another in series.

5. The device of claim 4, wherein the at least one electrical consumer is situated in a vehicle electrical system having at least one voltage-stabilizing component.

6. The device of claim 4, wherein the modules are electrically connected to each other by switches.

7. The device of claim 6, wherein the switches are semiconductor switches.

8. The device of claim 4, further comprising:
    at least one sensor unit configured to measure temperatures of hot sides or cold sides of the plurality of thermoelectric modules.

* * * * *